(12) United States Patent
Wei et al.

(10) Patent No.: US 7,948,355 B2
(45) Date of Patent: May 24, 2011

(54) EMBEDDED RESISTOR DEVICES

(75) Inventors: Chang-Lin Wei, Hsinchu (TW); Chang-Sheng Chen, Taipei (TW); Cheng-Hua Tsai, Yonghe (TW); Syun Yu, Chiayi (TW); Chin-Sun Shyu, Wunchuan Village (TW)

(73) Assignee: Industrial Technology Research Institute (TW)

( * ) Notice: Subject to any disclaimer, the term of this patent is extended or adjusted under 35 U.S.C. 154(b) by 589 days.

(21) Appl. No.: 11/852,244

(22) Filed: Sep. 7, 2007

(65) Prior Publication Data
US 2008/0290984 A1 Nov. 27, 2008

Related U.S. Application Data

(60) Provisional application No. 60/940,069, filed on May 24, 2007.

(51) Int. Cl.
*H01C 1/012* (2006.01)
(52) U.S. Cl. .................. 338/309; 338/306; 338/307
(58) Field of Classification Search .............. 338/309, 338/306, 307
See application file for complete search history.

(56) References Cited

U.S. PATENT DOCUMENTS

| | | | |
|---|---|---|---|
| 5,420,562 A | 5/1995 | Kaltenecker | |
| 6,148,502 A * | 11/2000 | Gerber et al. | 29/621 |
| 6,297,965 B1 * | 10/2001 | Sasaki et al. | 361/782 |
| 6,753,679 B1 * | 6/2004 | Kwong et al. | 324/158.1 |
| 6,798,666 B1 * | 9/2004 | Alexander et al. | 361/766 |
| 6,900,992 B2 * | 5/2005 | Kelly et al. | 361/794 |
| 6,975,517 B1 * | 12/2005 | Kwong et al. | 361/763 |
| 7,038,571 B2 | 5/2006 | Dunn et al. | |
| 7,573,365 B2 * | 8/2009 | Beck et al. | 338/35 |
| 2005/0212649 A1 * | 9/2005 | Schneekloth et al. | 338/51 |

* cited by examiner

*Primary Examiner* — Lincoln Donovan
*Assistant Examiner* — Joselito Baisa
(74) *Attorney, Agent, or Firm* — Alston & Bird LLP

(57) ABSTRACT

An embedded resistor device includes a resistor, a ground plane located near a first side of the resistor and electrically coupled to a first end of the resistor, at the ground plane a hole is provided, a first dielectric layer exists between the resistor and the ground plane, a conductive wire, which is electrically coupled to a second end of the resistor different from the first end of the resistor and partially surrounds the resistor, is used as an auxiliary for supporting a resistor-coating process of the resistor and to provide a terminal of the embedded resistor device at the conductive wire, a conductive region located near a second side of the ground plane different from the first side of the resistor, a second dielectric layer exists between the ground plane and the conductive region, and a conductive path to electrically couple the conductive wire to the conductive region through the hole.

37 Claims, 10 Drawing Sheets

EMBEDDED RESISTOR DEVICES

CROSS-REFERENCE TO RELATED APPLICATIONS

This application claims the benefit of U.S. Provisional Application No. 60/940,069, filed May 24, 2007.

BACKGROUND OF THE INVENTION

The present invention generally relates to embedded resistor devices and, more particularly, to embedded resistor devices with an improved radio frequency (RF) performance.

Resistors have been widely used in circuits such as current-limiting circuits, voltage regulators and termination impedance controllers. Some resistors may be mounted on circuit boards utilizing a relatively complicated process such as the surface mount technique (SMT), which may occupy large area on the circuit boards. To reduce the dimensions of resistors, embedded resistor devices have been developed, which may be formed by resistor-coating techniques. FIG. 1 shows a cross-sectional view of a conventional embedded resistor device 100. As illustrated in FIG. 1, the embedded resistor device 100 may include a resistor material 102 coated on a dielectric layer 104, which may be formed on a ground plane 106. The resistor material 102 may include one end coupled to the ground plane 106, and the other end coupled to a conductor as a terminal of the single-port, embedded resistor device 100. However, because errors may occur during circuit-printing on a circuit board, and defects may exist in a coating material, a calibration process may be required for adjusting the resistance of the embedded resistor device 100. The calibration process may be performed with a laser machine and may increase the manufacturing cost.

Furthermore, because the embedded resistor device 100 may include different kinds of materials in different layers manufactured by different processes, parasitic effects may occur, such as between the resistor material 102 and the ground plane 106. The parasitic effects may deteriorate the electrical characteristics of the embedded resistor device 100. Moreover, the parasitic effects may increase with the operating frequency of the embedded resistor device 100. In radio-frequency applications, the required impedance may be hundreds to thousands of ohms. However, the parasitic effects may reduce the actual impedance of the conventional embedded resistor device 100 to several to tens of ohms. FIG. 2 shows a diagram of the impedance magnitude of the embedded resistor device 100 illustrated in FIG. 1 at various frequencies. As illustrate in FIG. 2, the impedance may decrease as the operating frequency increases. In some applications such as radio frequency (RF) circuits, the embedded resistor device 100 may not be acceptable due to abrupt decrease in impedance.

Many embedded resistor device structures have been proposed to provide improved frequency performance. For example, U.S. Pat. No. 7,038,571 to Dunn et. al, entitled "Polymer Thick Film Resistor, Layout Cell, and Method," and U.S. Pat. No. 5,420,562 to Kaltenecker, entitled "Resistor Having Geometry for Enhancing Radio Frequency Performance" described some embedded resistor device structures. However, conventional devices sometimes do not provide a relatively high impedance at a relatively high operating frequency or are not suitable for designs with a relatively large length/width ratio. Therefore, there may be a need for an embedded resistor device providing an improved frequency performance.

BRIEF SUMMARY OF THE INVENTION

Examples of the present invention may include an embedded resistor device comprising a resistor, a ground plane located near a first side of the resistor and electrically coupled to a first end of the resistor, at the ground plane a hole is provided, a first dielectric layer exists between the resistor and the ground plane, a conductive wire, which is electrically coupled to a second end of the resistor different from the first end of the resistor and partially surrounds the resistor, is used as an auxiliary for supporting a resistor-coating process of the resistor and to provide a terminal of the embedded resistor device at the conductive wire, a conductive region located near a second side of the ground plane different from the first side of the resistor, a second dielectric layer exists between the ground plane and the conductive region, and a conductive path to electrically couple the conductive wire to the conductive region through the hole.

Some examples of the present invention may also include an embedded resistor device comprising a resistor, a ground plane located near a first side of the resistor and electrically coupled to a first end of the resistor, at the ground plane a plurality of holes are provided, a first dielectric layer exists between the resistor and the ground plane, a conductive wire, which is electrically coupled to a second end of the resistor different from the first end of the resistor and partially surrounds the resistor, is used as an auxiliary for supporting a resistor-coating process of the resistor and to provide a terminal of the embedded resistor device at the conductive wire, a conductive region located near a second side of the ground plane different from the first side of the resistor, a second dielectric layer exists between the ground plane and the conductive region, and a plurality of conductive paths to electrically couple the conductive wire to the conductive region through the plurality of holes.

Examples of the present invention may further include an embedded resistor device comprising a resistor, a ground plane located near a first side of the resistor and electrically coupled to a first end of the resistor, at the ground plane a plurality of holes are provided, a first dielectric layer exists between the resistor and the ground plane, a conductive wire, which is electrically coupled to a second end of the resistor different from the first end of the resistor and partially surrounds the resistor, is used as an auxiliary for supporting a resistor-coating process of the resistor and to provide a terminal of the embedded resistor device at the conductive wire, a plurality of conductive regions located near a second side of the ground plane different from the first side of the resistor, a second dielectric layer exists between the ground plane and the plurality of conductive regions, and a plurality of conductive paths to electrically couple the conductive wire to the plurality of conductive regions through the plurality of holes.

Examples of the present invention may further include an embedded resistor device comprising a resistor, a ground plane located near a first side of the resistor at which a hole is provided, a first dielectric layer exists between the resistor and the ground plane, a first terminal of the embedded resistor device which is electrically coupled to a first end of the resistor, a conductive wire, which is electrically coupled to a second end of the resistor different from the first end of the resistor and partially surrounds the resistor, is used as an auxiliary for supporting a resistor-coating process of the resistor and to provide a second terminal of the embedded resistor device, a conductive region located near a second side of the ground plane different from the first side of the resistor, a second dielectric layer exists between the ground plane and the conductive region, and a conductive path to electrically couple the conductive wire to the conductive region through the hole.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions.

Figure 3A:
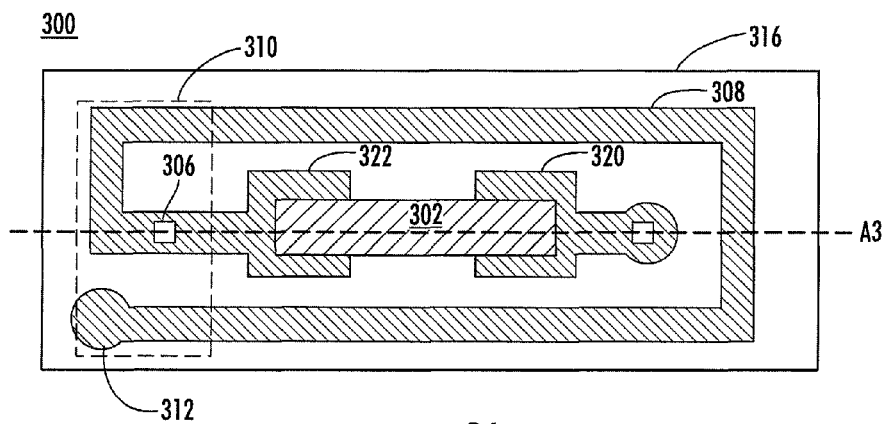
FIG. 3A is a top plan view of an embedded resistor device consistent with an example of the present invention.

FIG. 3A is a top plan view of an embedded resistor device 300 consistent with an example of the present invention. Referring to FIG. 3A, the embedded resistor device 300 may include a resistor 302 having a first end 320 and a second end 322, a conductive path 306 (extending inwardly into the paper), a conductive wire 308, a conductive region 310, a terminal 312, and a first dielectric layer 316. In one example, the resistor 302 may be formed in a resistor-coating process by coating a resistor material on a region of the first dielectric layer 316. In some examples, the resistor material may include at least one of carbon, silver or nickel and/or the resistor material may have a conductivity of approximately 29.4 Simens/m and a relative permittivity of approximately 8. Manufacturing variations or other limitations may prevent the resistor 302 from forming uniformly during the resistor-coating process. To improve uniformity, the conductive wire 308 may be formed before the resistor material is coated. The conductive wire 308 may serve as a bracing for the later-coated resistor material, which may facilitate the formation with a more uniform thickness of the resistor 302 to provide a more accurate direct-current (DC) resistance. The conductive wire 308 may include a winding path, which may surround the resistor 302. In another example, the conductive wire 308 may include a straight-line path, which may partially surround or neighbor the resistor 302. In some examples, a resistor device with a winding conductive wire extending near both sides of a resistor may result in a more accurate resistance value than a resistor with a linear conductive wire extending near one side of a resistor. Skilled persons in the art will understand that the shape or length of the conductive wire 308 may be varied in many different ways to affect the equivalent impedance of the embedded resistor device 300. In one example, the conductive wire 308 may be formed with at least one of copper, gold, silver or aluminum. The terminal 312 may be provided at one end or at a point on the extending path of the conductive wire 308. The conductive path 306 may electrically couple the conductive wire 308 to a conductive region 310 (illustrated in a dash-line block).

Figure 3B:
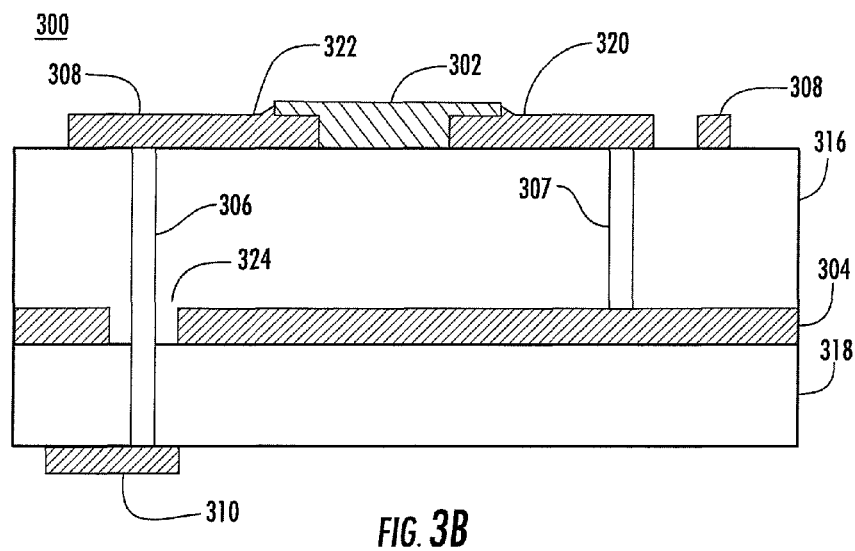
FIG. 3B is a cross-sectional view of the embedded resistor device along a dash line A3 shown in FIG. 3A.

FIG. 3B is a cross-sectional view of the embedded resistor device 300 illustrated in FIG. 3A along a dash line A3. Referring to FIG. 3B, the resistor 302 may further include a first end 320 and a second end 322. The first end 320 may be electrically coupled via another conductive path 307 to a ground plane 304, which in turn may be electrically coupled to a voltage ground of a circuit. The second end 322 may be electrically coupled to the other end of the conductive wire 308 and then to the conductive region 310 via the conductive path 306 through a hole 324 in the ground plane 304.

Parasitic effects may occur when the embedded resistor device 300 operates at a relatively high frequency. The parasitic effects may be caused by a parasitic capacitance between the second end 322 and the ground plane 304, which are spaced apart by the first dielectric layer 316. The parasitic effects may also be caused by a parasitic capacitance between the conductive region 310 and the ground plane 304, which are spaced apart from one another by a second dielectric 318. The first dielectric layer 316 and the second dielectric layer 318 may include one of an insulating, layer, a ceramic layer and an organic layer. In one example, the first dielectric layer 316 and the second dielectric layer 318 may include a material selected from but not limited to FR370, FR4, FR5, ARLON 25, Mitsubishi BT, and Duroid. Skilled persons in the art will understand that the materials of dielectric layers may be varied and may determine the parasitic capacitance value caused by the parasitic effects.

Figure 1:
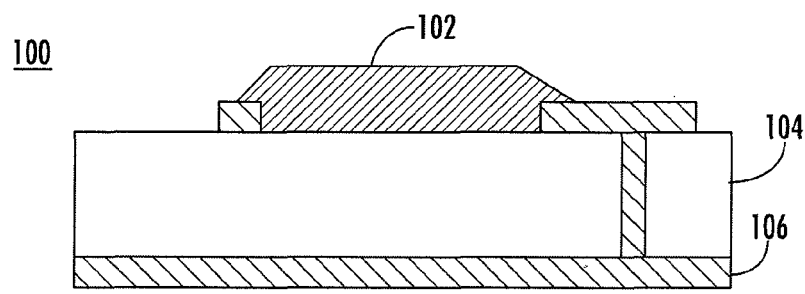
FIG. 1 is a cross-sectional view of a conventional embedded resistor device.
Figure 2:
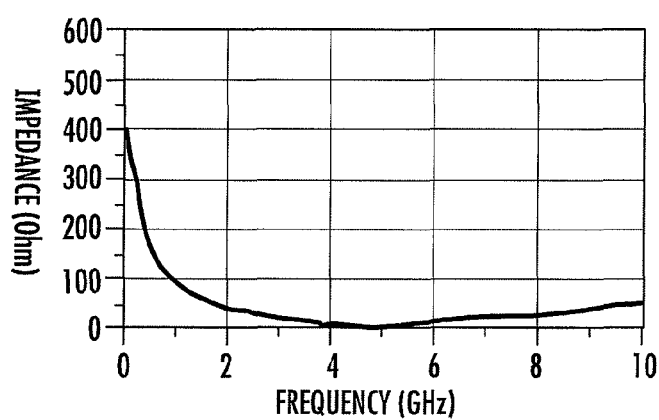
FIG. 2 is a diagram illustrating the impedance of the conventional embedded resistor device illustrated in FIG. 1 in various operating frequencies.
Figure 7:
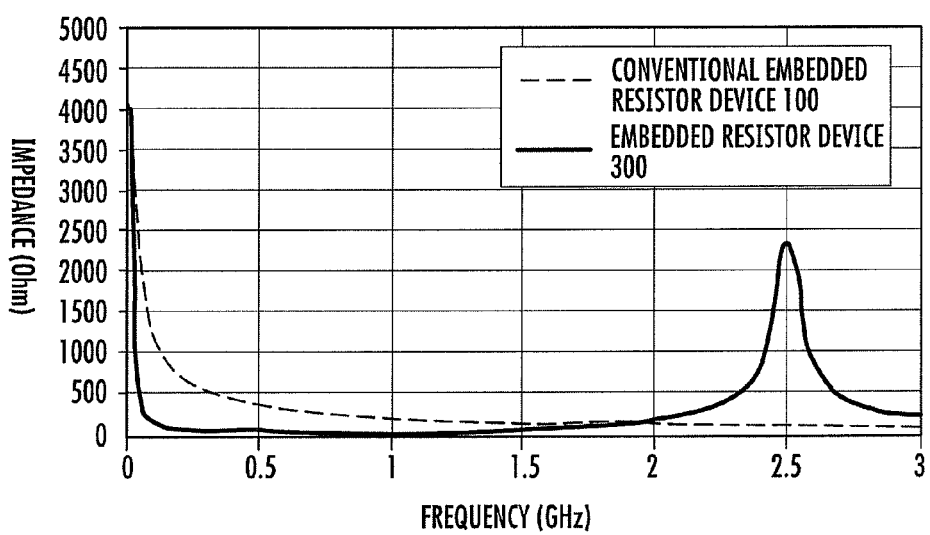
FIG. 7 is a diagram illustrating the impedance of the embedded resistor device shown in FIG. 3A and FIG. 3B in various frequencies.

The conductive region 310 may serve as an open-ended transmission line of the embedded resistor device 300. A transmission line may refer to a medium or structure that forms all or part of a path from one place to another for directing the transmission of energy, such as electromagnetic waves or acoustic waves, as well as electric power transmission. Such an open-ended transmission line may be equivalent to adding a pole into the frequency response of the embedded resistor device 300 at high frequency. The conductive region 310 may be formed by an etching, depositing or circuit-printing process. Furthermore, the conductive region 310 may include but is not limited to a rectangular, spiral or radial-bar shape. FIG. 7 shows a diagram of the impedance of the embedded resistor device 300 in various frequencies. Referring to FIG. 7, a pole is added at a frequency of approximately 2.5 GHz so that an impedance of the embedded resistor device 300 at the frequency may be improved. A simulation with the help of the Ansoft HFSS simulation software reveals that the impedance of the resistor device 300 at the radio frequency is approximately 2500 ohms, which is significantly improved as compared to that of the resistor device 100 illustrated in FIG. 1. As a result, the resistor device 300 may have a better performance and may prevent power consumption in radio-frequency applications than the conventional resistor device 100. Moreover, the conductive region 310 may include but is not limited to copper, silver, gold and aluminum. Skilled persons in the art will understand that the shape, size and material of the conductive region 310 may affect the performance of the open-ended transmission line and in turn the frequency response of the embedded resistor device 300. By choosing the parameters and material of the conductive region 310, various equivalent impedances of the embedded resistor device 300 for high frequency applications may be obtained.

Figure 3C:
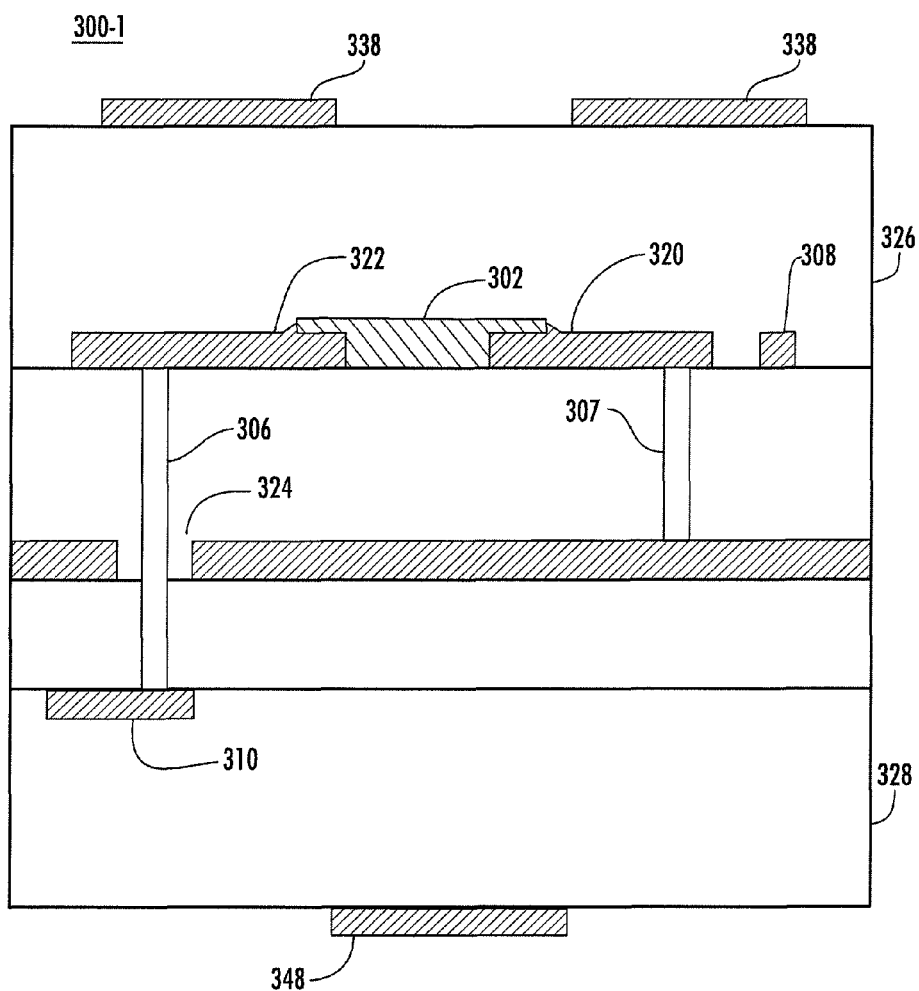
FIG. 3C is a cross-sectional view of an embedded resistor device having a multilayer structure based on the structure illustrated in FIG. 3B.

FIG. 3C is a cross-sectional view of an embedded resistor device 300-1 having a multilayer structure based on the structure illustrated in FIG. 3B. The embedded resistor device 300-1 may be similar to the embedded resistor device 300 described and illustrated with reference to FIG. 3B except that, for example, additional dielectric layers 326 and 328 are added. Furthermore, additional connectors, wires or conductors 338 and 348 may be formed on the dielectric layers 326 and 328.

Figure 4A:
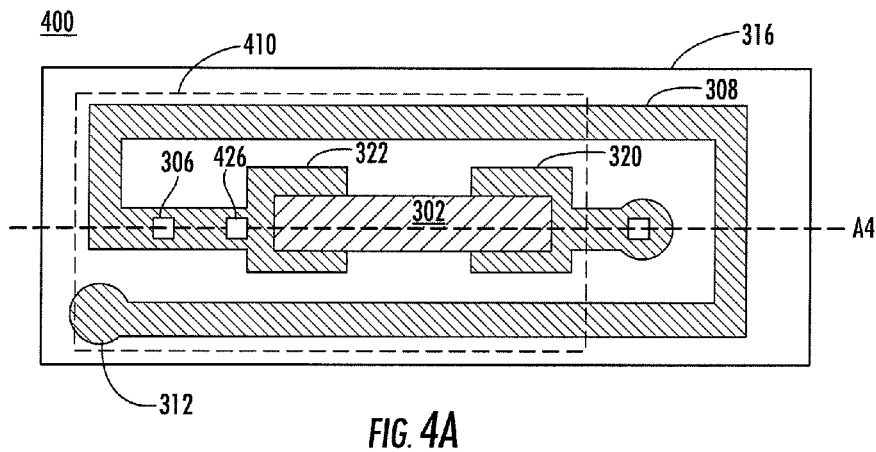
FIG. 4A is a top plan view of an embedded resistor device consistent with another example of the present invention.
Figure 4B:
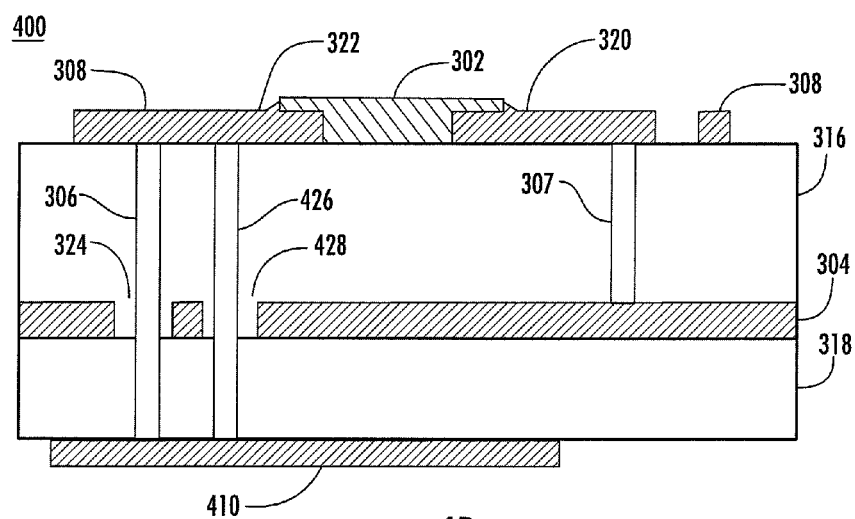
FIG. 4B is a cross-sectional view of the embedded resistor device along a dash line A4 shown in FIG. 4A.

FIGS. 4A and 4B are respectively a top plan view and a cross-sectional view of an embedded resistor device 400 according to another example of the present invention. Referring to FIG. 4A, the embedded resistor device 400 may be similar to the embedded resistor 300 illustrated in FIG. 3A except that, for example, a conductive path 426 is added. Referring to FIG. 4B, the conductive path 426 may electrically couple the conductive wire 308 to a conductive region 410 through another hole 428 in the ground plane 304. In other examples, three or more conductive paths may be provided to electrically couple the conductive wire 308 to the conductive region 410.

Figure 4C:
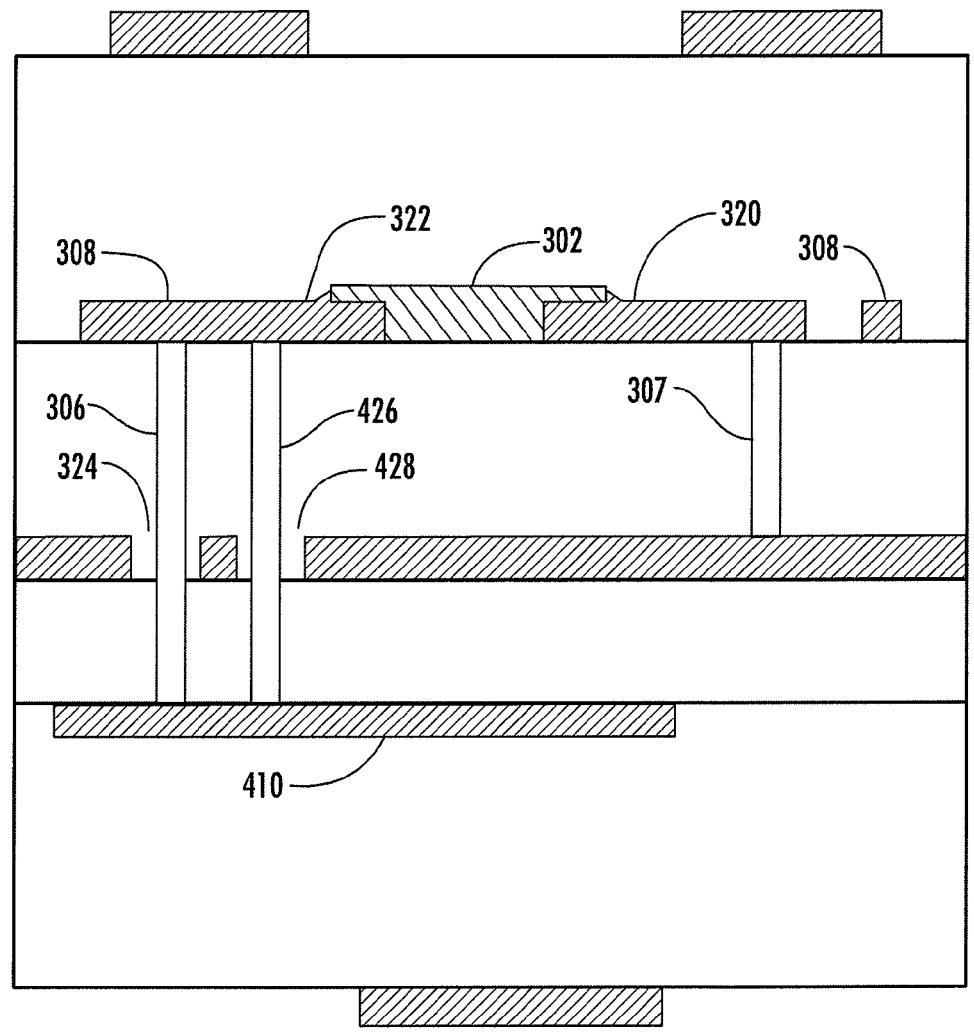
FIG. 4C is a cross-sectional view of an embedded resistor device having a multilayer structure based on the structure illustrated in FIG. 4B.

FIG. 4C is a cross-sectional view of an embedded resistor device 400-1 having a multilayer structure based on the structure illustrated in FIG. 4B. The embedded resistor device 400-1 may be similar to the embedded resistor device 400 described and illustrated with reference to FIG. 4B except that, for example, additional dielectric layers (not numbered) and additional conductive wires (not numbered) may be added.

Figure 5A:
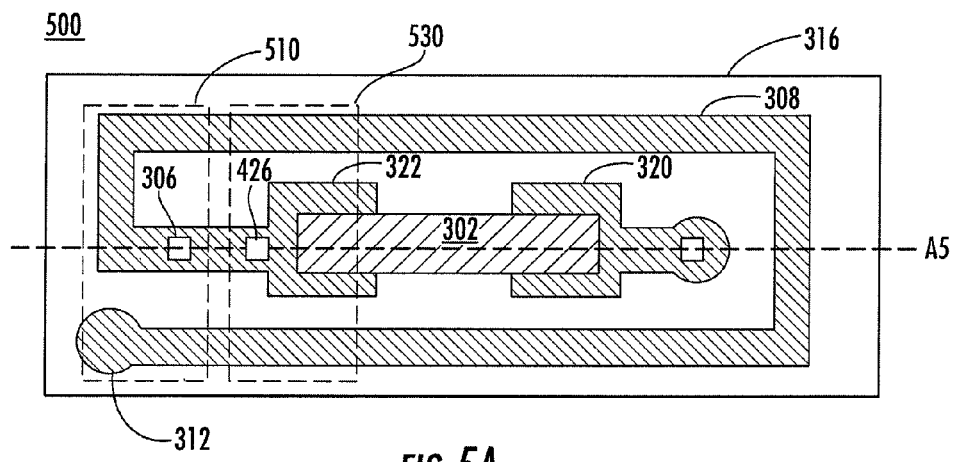
FIG. 5A is a top plan view of an embedded resistor device consistent with still another example of the present invention.
Figure 5B:
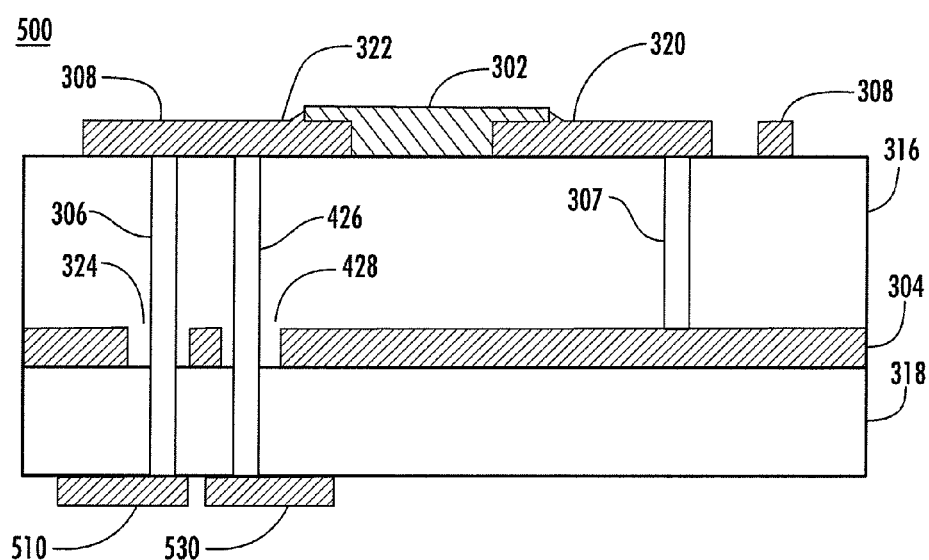
FIG. 5B is a cross-sectional view of the embedded resistor device along a dash line A5 shown in FIG. 5A.

FIGS. 5A and 5B are respectively a top plan view and a cross-sectional view of an embedded resistor device 500 according to still another example of the present invention. Referring to FIG. 5A, the embedded resistor device 500 may be similar to the embedded resistor device 400 illustrated in FIG. 4A except, for example, conductive regions 510 and 530. Referring to FIG. 5B, the conductive regions 510 and 530 may be spaced apart from one another, and coupled with the conductive paths 306 and 426, respectively. In other examples, three or more conductive paths may be provided to electrically couple the conductive wire 308 to three or more corresponding conductive regions.

Figure 5C:
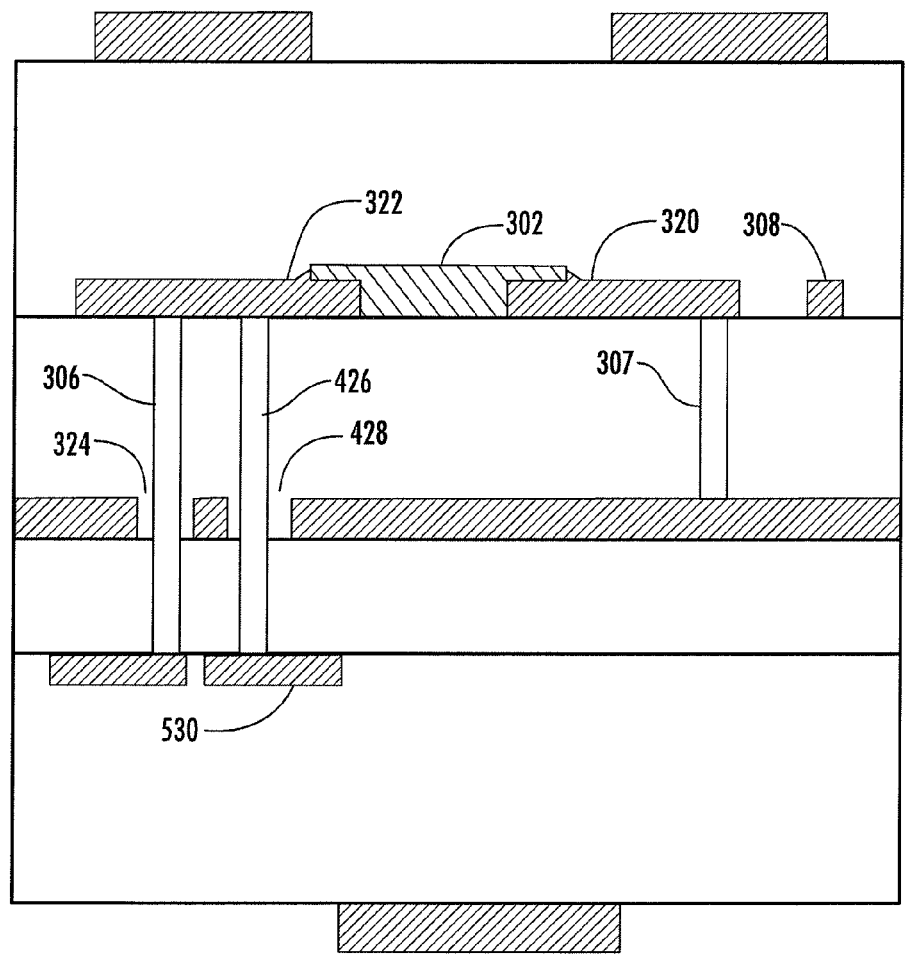
FIG. 5C is a cross-sectional view of an embedded resistor device having a multilayer structure based on the structure illustrated in FIG. 5B.

FIG. 5C is a cross-sectional view of an embedded resistor device 500-1 having a multilayer structure based on the structure illustrated in FIG. 5B. The embedded resistor device 500-1 may be similar to the embedded resistor device 500 described and illustrated with reference to FIG. 5B except that, for example, additional dielectric layers (not numbered) and additional conductive wires (not numbered) may be added.

Figure 6A:
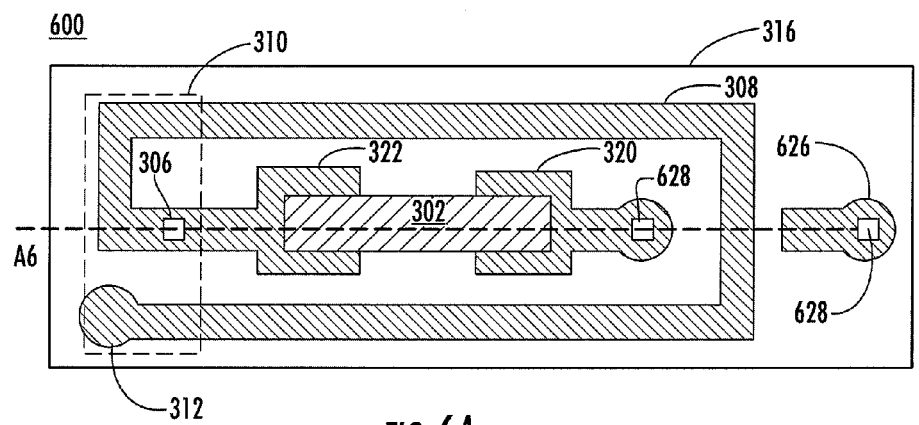
FIG. 6A is a top plan view of an embedded resistor device consistent with yet another example of the present invention.
Figure 6B:
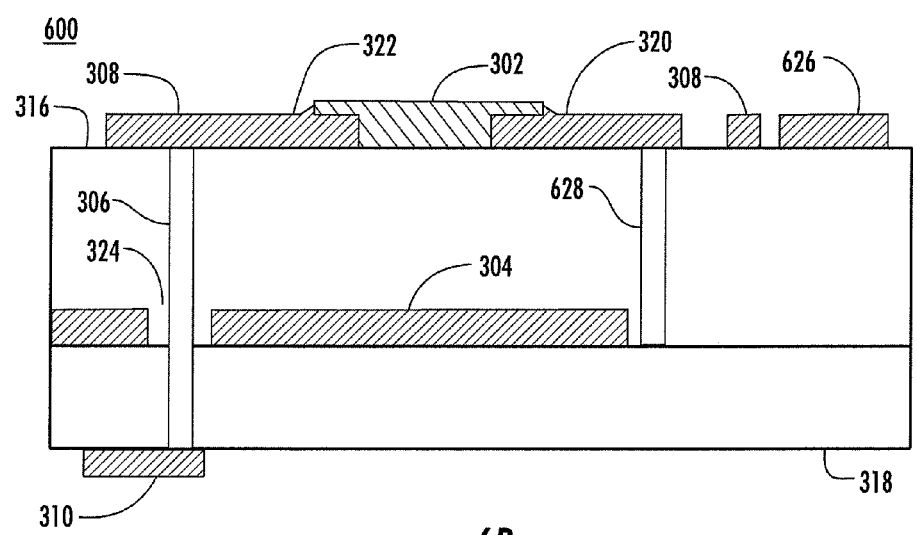
FIG. 6B is a cross-sectional view of the embedded resistor device along a dash line A6 shown in FIG. 6A.

FIGS. 6A and 6B are respectively a top plan view and a cross-sectional view of an embedded resistor device 600 according to yet another example of the present invention. The embedded resistor device 600 includes a two-port structure, which is different from the single-port structures illustrated in FIGS. 3A to 5B. Referring to FIG. 6A, the embedded resistor device 600 may be similar to the embedded resistor device 300 illustrated in FIG. 3A except that, for example, a conductor 628 is added. Also referring to FIG. 6B, the conductor 628 may electrically couple the first end 320 of the resistor 302 to a terminal 626. The terminals 312 and 626 form the two ports of the embedded resistor device 600.

Figure 6C:
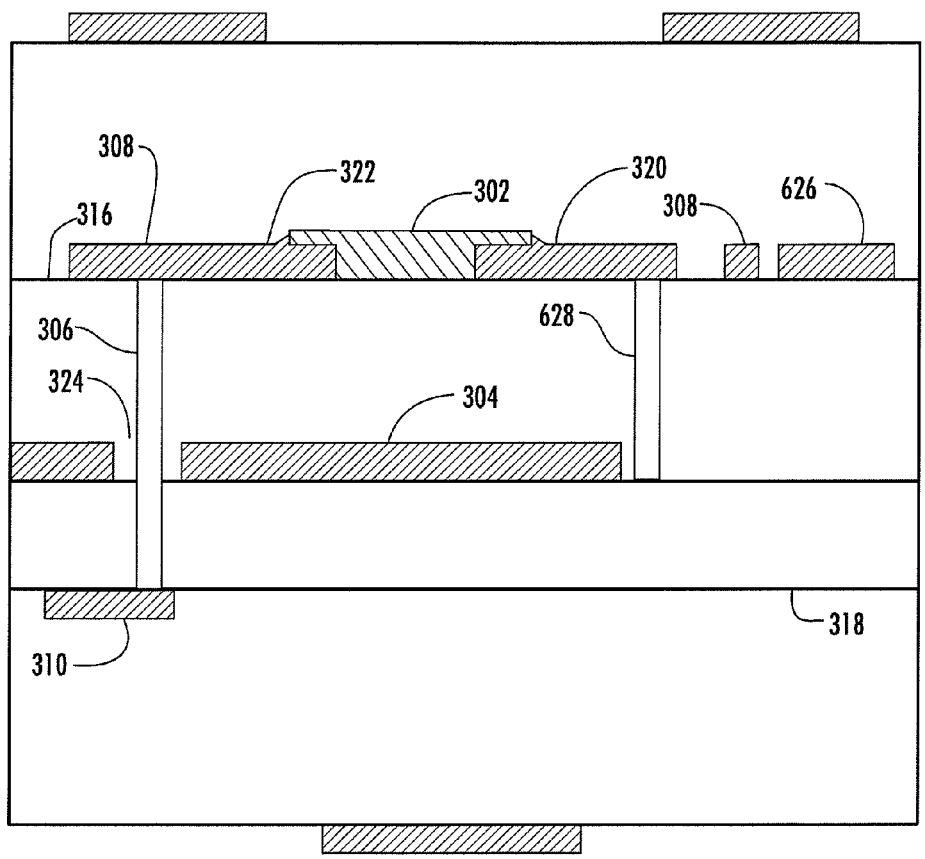
FIG. 6C is a cross-sectional view of an embedded resistor device having a multilayer structure based on the structure illustrated in FIG. 6B.

FIG. 6C is a cross-sectional view of an embedded resistor device 600-1 having a multilayer structure based on the structure illustrated in FIG. 6B. The embedded resistor device 600-1 may be similar to the embedded resistor device 600 described and illustrated with reference to FIG. 6B except that, for example, additional dielectric layers (not numbered) and additional conductive wires (not numbered) may be added.

In describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:
1. An embedded resistor device comprising:
a first dielectric layer, second dielectric layer and a ground plane disposed therebetween;
a resistor material disposed on the first dielectric layer such that the first dielectric layer is between the resistor mate- rial and the ground plane, the resistor material including a first end, second end and a pair of sides therebetween;

a conductive region disposed on the second dielectric layer such that the second dielectric layer is between the conductive region and the ground plane;

a conductive wire disposed on the first dielectric layer and coupled to the first end of the resistor material, the conductive wire having a path that extends along at least one of the sides of the resistor material such that the conductive wire at least partially surrounds or neighbors the resistor material; and a conductive path extending through the first dielectric layer, ground plane and second dielectric layer, the conductive path electrically coupling the conductive wire and conductive region.

2. The embedded resistor device of claim 1, wherein the conductive region forms an open-ended transmission line.

3. The embedded resistor device of claim 1, wherein the second end of the resistive region is electrically coupled to the ground plane via a conductive path.

4. The embedded resistor device of claim 1, wherein the pair of sides of the resistive region includes first and second longitudinal sides, and the conductive wire extends along at least the first longitudinal side of the resistive region.

5. The embedded resistor device of claim 1, wherein the pair of sides of the resistive region includes a pair of longitudinal sides, and the conductive wire extends from the first end to the second end along the pair of longitudinal sides.

6. The embedded resistor device of claim 1, wherein the conductive region includes one of a rectangular, spiral or radial-bar shape.

7. The embedded resistor device of claim 1 further comprising a conductor to electrically couple the second end of the resistive region to an electrode.

8. The embedded resistor device of claim 1, wherein the conductive path comprises a plurality of conductive paths extending through the first dielectric layer, ground plane and second dielectric layer, the plurality of conductive paths electrically coupling the conductive wire to the conductive region.

9. The embedded resistor device of claim 1, wherein the conductive region comprises a plurality of conductive regions spaced apart from each other, and wherein the conductive path comprises a plurality of conductive paths extending through the first dielectric layer, ground plane and second dielectric layer, the conductive paths electrically coupling the conductive wire and respective ones of the conductive regions.

10. The embedded resistor device of claim 1, wherein the conductive wire has a winding or straight-line path that extends along at least one of the sides of the resistor material such that the conductive wire at least partially surrounds or neighbors the resistor material.

11. The embedded resistor device of claim 1, wherein the conductive wire is coupled to and extends from the first end of the resistor material to a terminal forming a port of the embedded resistor device, the terminal being spaced-apart from but disposed proximate to the first end of the resistor material.

12. The embedded resistor device of claim 1, wherein the conductive wire has a path that extends along and that is spaced-apart from the resistor material such that the conductive wire at least partially surrounds or neighbors the resistor material.

13. An embedded resistor device comprising:

a first dielectric layer, a second dielectric layer and a ground plane disposed therebetween;

a resistor material disposed on the first dielectric layer such that the first dielectric layer is between the resistor material and the ground plane;

a conductive region disposed on the second dielectric layer such that the second dielectric layer is between the conductive region and the ground plane;

a conductive wire disposed on the first dielectric layer and coupled to a first end of the resistor material, the conductive wire having a path that at least partially surrounds or surrounds the resistor material; and a conductive path extending through the first dielectric layer, ground plane and second dielectric layer, the conductive path electrically coupling the conductive wire and conductive region.

14. The embedded resistor device of claim 13, wherein the conductive region forms an open-ended transmission line for the embedded resistor device.

15. The embedded resistor device of claim 13 further comprising a second conductive path extending through the first dielectric layer, the second conductive path electrically coupling the resistor material and ground plane.

16. The embedded resistor device of claim 13, wherein the conducive wire includes a first end coupled to the first end of the resistor material, and wherein the conductive wire extends from the first end to a second end such that the conductive wire winds around the resistor material.

17. The embedded resistor device of claim 13, wherein the resistor material extends longitudinally on the first dielectric layer, wherein the conducive wire includes a first end coupled to the first end of the resistor material, and wherein the conductive wire extends from the first end to a second end such that at least a portion of the conductive wire extends longitudinally alongside the resistor material on the first dielectric material.

18. The embedded resistor device of claim 13, wherein the conductive region includes one of a rectangular, spiral or radial-bar shape.

19. The embedded resistor device of claim 13, wherein the conducive Wire extends from the resistor material to a terminal forming a first port of the embedded resistor device, and wherein the embedded resistor device further comprises:

a conductor coupled to and extending from the resistor material to another terminal forming a second port of the embedded resistor device.

20. The embedded resistor device of claim 13, wherein the conductive path comprises a plurality of conductive paths extending through the first dielectric layer, ground plane and second dielectric layer, the plurality of conductive paths electrically coupling the resistor material and conductive region.

21. The embedded resistor device of claim 13, wherein the conductive region comprises a plurality of conductive regions spaced apart from each other, and wherein the conductive path comprises a plurality of conductive paths extending through the first dielectric layer, ground plane and second dielectric layer, the conductive paths electrically coupling the resistor material and respective ones of the conductive regions.

22. The embedded resistor device of claim 13, wherein the conductive wire has a winding or straight-line path that that at least partially surrounds or surrounds the resistor material.

23. The embedded resistor device of claim 13, wherein the resistor material has first and second opposed ends, and wherein the conductive wire is coupled to and extends from the first end of the resistor material to a terminal forming a port of the embedded resistor device, the terminal being spaced-apart from but disposed proximate to the first end of the resistor material.

24. The embedded resistor device of claim 13, wherein the conductive wire has a path that extends along and that is spaced-apart from the resistor material such that the conductive wire at least partially surrounds or surrounds the resistor material.

25. The embedded resistor device of claim 13, wherein the resistor material includes a pair of sides, and wherein the conductive wire has a path that extends along at least one of the sides of the resistor material such that the conductive wire at least partially surrounds or neighbors the resistor material.

26. An embedded resistor device comprising:
   a first dielectric layer, a second dielectric layer and a ground plane disposed therebetween;
   a resistor material disposed on the first dielectric layer such that the first dielectric layer is between the resistor material and the ground plane;
   a conductive region disposed on the second dielectric layer such that the second dielectric layer is between the conductive region and the ground plane;
   a conductive wire disposed on the first dielectric layer and coupled to a first end of the resistor material, the conductive wire having a path that extends along and that is spaced-apart from the resistor material such that the conductive wire at least partially surrounds or neighbors the resistor material; and
   a conductive path extending through the first dielectric layer, ground plane and second dielectric layer, the conductive path electrically coupling the conductive wire and conductive region.

27. The embedded resistor device of claim 26, wherein the conductive wire has a winding or straight-line path that that at least partially surrounds or neighbors the resistor material.

28. The embedded resistor device of claim 26, wherein the resistor material has first and second opposed ends, and wherein the conductive wire is coupled to and extends from the first end of the resistor material to a terminal forming a port of the embedded resistor device, the terminal being spaced-apart from but disposed proximate to the first end of the resistor material.

29. The embedded resistor device of claim 26, wherein the resistor material includes a pair of sides, and wherein the conductive wire has a path that extends along at least one of the sides of the resistor material such that the conductive wire at least partially surrounds or neighbors the resistor material.

30. The embedded resistor device of claim 26, wherein the conductive region forms an open-ended transmission line for the embedded resistor device.

31. The embedded resistor device of claim 26 further comprising a second conductive path extending through the first dielectric layer, the second conductive path electrically coupling the resistor material and ground plane.

32. The embedded resistor device of claim 26, wherein the conducive wire includes a first end coupled to the first end of the resistor material, and wherein the conductive wire extends from the first end to a second end such that the conductive wire winds around the resistor material.

33. The embedded resistor device of claim 26, wherein the resistor material extends longitudinally on the first dielectric layer,
   wherein the conducive wire includes a first end coupled to the first end of the resistor material, and wherein the conductive wire extends from the first end to a second end such that at least a portion of the conductive wire extends longitudinally alongside the resistor material on the first dielectric material.

34. The embedded resistor device of claim 26, wherein the conductive region includes one of a rectangular, spiral or radial-bar shape.

35. The embedded resistor device of claim 26, wherein the conducive wire extends from the resistor material to a terminal forming a first port of the embedded resistor device, and wherein the embedded resistor device further comprises:
   a conductor coupled to and extending from the resistor material to another terminal forming a second port of the embedded resistor device.

36. The embedded resistor device of claim 26, wherein the conductive path comprises a plurality of conductive paths extending through the first dielectric layer, ground plane and second dielectric layer, the plurality of conductive paths electrically coupling the resistor material and conductive region.

37. The embedded resistor device of claim 26, wherein the conductive region comprises a plurality of conductive regions spaced apart from each other, and
   wherein the conductive path comprises a plurality of conductive paths extending through the first dielectric layer, ground plane and second dielectric layer, the conductive paths electrically coupling the resistor material and respective ones of the conductive regions.

* * * * *